US012612689B2

(12) United States Patent
Kim et al.

(10) Patent No.: US 12,612,689 B2
(45) Date of Patent: Apr. 28, 2026

(54) MASK STICK AND MASK ASSEMBLY INCLUDING THE SAME

(71) Applicant: Samsung Display Co., LTD., Yongin-si (KR)

(72) Inventors: Sanghoon Kim, Yongin-si (KR); Yeonju Kang, Yongin-si (KR); Sang Shin Lee, Yongin-si (KR); Seung Jin Lee, Yongin-si (KR); Minji Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 397 days.

(21) Appl. No.: 18/324,623

(22) Filed: May 26, 2023

(65) Prior Publication Data

US 2024/0076772 A1    Mar. 7, 2024

(30) Foreign Application Priority Data

Sep. 7, 2022    (KR) ........................ 10-2022-0113639

(51) Int. Cl.
| *C23C 14/04* | (2006.01) |
| *C23C 14/24* | (2006.01) |
| *H10K 59/40* | (2023.01) |

(52) U.S. Cl.
CPC ............ *C23C 14/042* (2013.01); *C23C 14/24* (2013.01); *H10K 59/40* (2023.02)

(58) Field of Classification Search
CPC ...... C23C 14/24; C23C 14/042; H10K 71/166
See application file for complete search history.

(56) References Cited

U.S. PATENT DOCUMENTS

| 2016/0122860 A1* | 5/2016 | Kim ........................ H10K 71/60 118/505 |
| 2020/0357998 A1* | 11/2020 | Bai ........................ H10K 71/60 |
| 2020/0385856 A1* | 12/2020 | Yamabuchi .......... H10K 71/166 |
| 2021/0265396 A1 | 8/2021 | Kim et al. |

FOREIGN PATENT DOCUMENTS

| KR | 10-2020-0026354 A | 3/2020 |
| KR | 10-2020-0039901 A | 4/2020 |
| KR | 10-2404576 | 6/2022 |

* cited by examiner

*Primary Examiner* — Joseph A Miller, Jr.
(74) *Attorney, Agent, or Firm* — Womble Bond Dickinson (US) LLP

(57) ABSTRACT

One or more embodiments provides a mask assembly including a frame defining an opening, a mask stick above the frame, extending in a first direction, defining through-holes, and including pattern areas that include one or more first non-hole portions in which no through-hole exists, and one or more second non-hole portions in which no through-hole exists, and a first support stick between the frame and the mask stick, extending in a second direction crossing the first direction, and overlapping the one or more second non-hole portions.

8 Claims, 11 Drawing Sheets

FIG. 7

MASK STICK AND MASK ASSEMBLY INCLUDING THE SAME

CROSS-REFERENCE TO RELATED APPLICATION

This application claims priority to, and the benefit of, Korean Patent Application No. 10-2022-0113639, filed in the Korean Intellectual Property Office on Sep. 7, 2022, the entire contents of which are incorporated herein by reference.

BACKGROUND

1. Field

The described technology relates to a mask stick that can be used in manufacturing a display device in which a display area has an opening, and a mask assembly including the same.

2. Description of the Related Art

A mask for deposition may be used in a process for manufacturing a display device. A metal mask, such as a fine metal mask or an open mask, may be used in a deposition process for forming an emission layer, an electrode layer, and the like on a substrate. For example, a substrate on which an emission layer is to be formed is aligned on a mask on which a pattern (e.g., predetermined pattern) is formed, and a material of the emission layer may be deposited on the substrate by passing through-holes of the mask.

As the mask becomes larger in area, an etching error for pattern formation also increases, and sagging of a center portion due to its own weight becomes severe, and thus recently, a mask assembly, in which a mask is divided into sticks and the mask sticks are fixed to a frame, is used.

The above information disclosed in this Background section is only for enhancement of understanding of the background of the described technology, and therefore, it may contain information that does not form the prior art that is already known in this country to a person of ordinary skill in the art.

SUMMARY

Among display devices that display an image, there is a display device in which an area occupied by a display area is enlarged, and the display area has an opening to add various functions. The display device including/defining the opening may form the opening through laser cutting after depositing each layer in the display area, and in this case, foreign substances may be generated due to an organic material deposited in the opening, which may cause defects. Embodiments provide a mask stick and a mask assembly capable of reducing a defect rate in a manufacturing process of a display device including/defining an opening.

One or more embodiments provide a mask assembly including a frame defining an opening, a mask stick above the frame, extending in a first direction, defining through-holes, and including pattern areas that include one or more first non-hole portions in which no through-hole exists, and one or more second non-hole portions in which no through-hole exists, and a first support stick between the frame and the mask stick, extending in a second direction crossing the first direction, and overlapping the one or more second non-hole portions.

The pattern areas may be divided by areas where the mask stick and the first support stick overlap.

The one or more first non-hole portions and the one or more second non-hole portions may be respectively at a first side and at a second side of the mask stick.

A number of the one or more first non-hole portions may be equal to a number of the one or more second non-hole portions of the mask stick.

The mask stick may be configured to be tensioned in the first direction to be fixed to the frame.

The one or more first non-hole portions and the one or more second non-hole portions may have a same planar area.

The one or more first non-hole portions or the one or more second non-hole portions may include concave portions at a surface of the mask stick, and having a thickness that is less than a thickness of the mask stick.

The one or more first non-hole portions or the one or more second non-hole portions may include concave portions at regular intervals.

The one or more first non-hole portions or the one or more second non-hole portions may include concave portions having a same planar shape.

One or more embodiments provide a mask stick that is configured to be tensioned in a first direction to be fixed to a frame, the mask stick including pattern areas defining through-holes, and including one or more first non-hole portions in which no through-hole exists at one side, and a division area dividing the pattern areas, and including one or more second non-hole portions in which no through-hole exists at an opposite side that is opposite to the one side.

The division area may overlap a first support stick above the frame and extending in a second direction crossing the first direction.

A number of the one or more first non-hole portions may be equal to a number of the one or more second non-hole portions.

The one or more first non-hole portions and the one or more second non-hole portions may have a same planar area.

The one or more first non-hole portions or the one or more second non-hole portions may include concave portions at a surface of the mask stick, and having a thickness that is less than a thickness of the mask stick.

The through-holes and the concave portions may be arranged at regular intervals.

The through-holes and the concave portions may have a same planar shape.

One or more embodiments provides a mask stick including deposition areas corresponding to display panels, and division areas dividing the deposition areas, extending in a first direction, and including one or more first non-hole portions in which concave portions are arranged at regular intervals at one side, through-holes outside the one or more first non-hole portions, arranged at regular intervals, and configured to allow a deposition material to pass therethrough, and one or more second non-hole portions in which concave portions are arranged at regular intervals at an opposite side that is opposite to the one side with respect to the first direction.

The display panels may include a display area for displaying an image, and an opening area within the display area and corresponding to the one or more first non-hole portions.

A number of the one or more first non-hole portions may be equal to a number of the one or more second non-hole portions.

The one or more first non-hole portions and the one or more second non-hole portions may have a same planar area.

According to the embodiments, it is possible to reduce or minimize bending during tension of a mask stick used in a manufacturing process of a display device. When manufacturing a display device including/defining an opening, a mask stick may include a non-hole portion in which a through-hole of the mask is not formed, such that an organic material is not deposited to correspond to the opening of the display area.

According to the embodiments, it is possible to ameliorate left-right asymmetry of a mask stick by providing a non-hole portion at a second end of the mask stick to correspond to a non-hole portion located at a first end of the mask stick used in a manufacturing process of a display device including/ defining an opening. In addition, when the mask stick is stretched, bending of the mask stick may be reduced or minimized, thereby improving pixel position accuracy (PPA).

BRIEF DESCRIPTION OF THE DRAWINGS

FIG. 7 illustrates a cross-sectional view taken along the line B-B' of FIG. 6.

DETAILED DESCRIPTION

Figure 1:
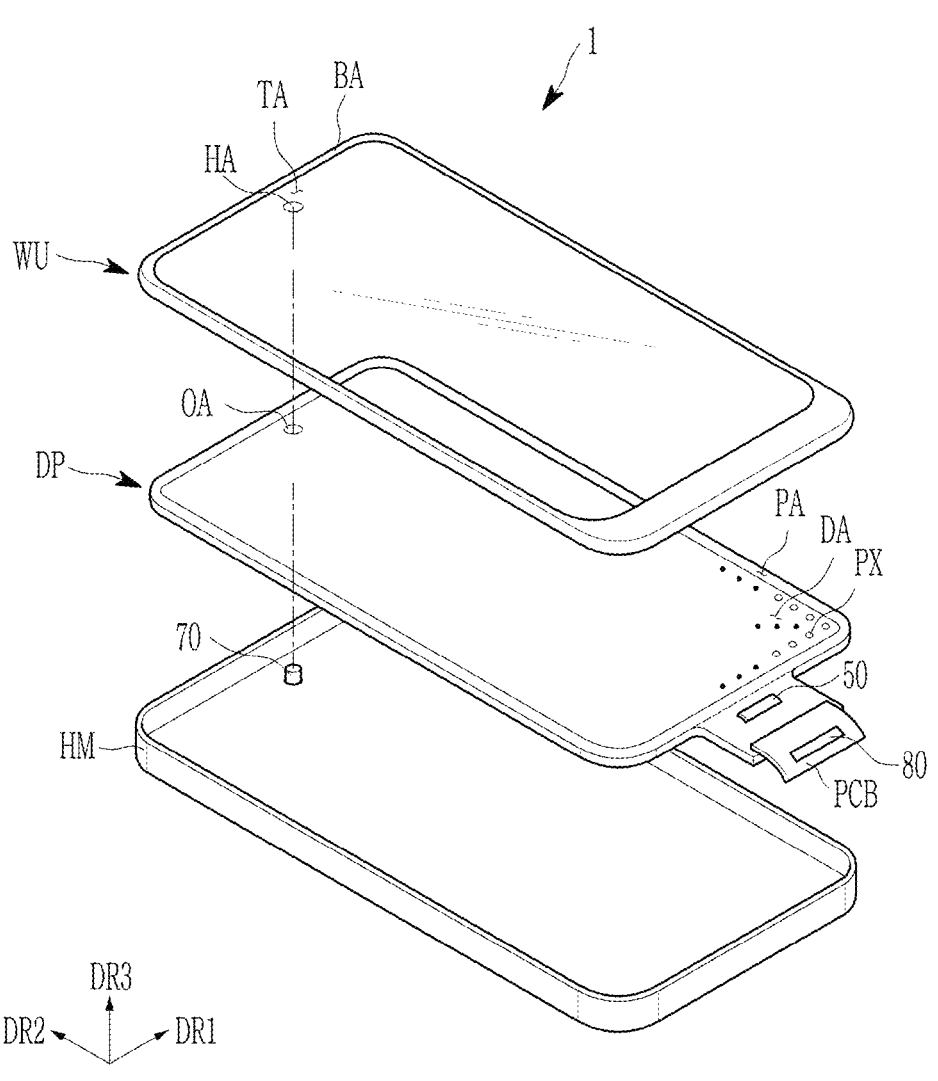
FIG. 1 illustrates a schematic exploded perspective view of a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In the drawings, signs "DR1", "DR2", and "DR3" are used to indicate directions, wherein DR1 is used for indicating a first direction, DR2 is used for indicating a second direction that is perpendicular to the first direction, and DR3 is used for indicating a third direction that is perpendicular to the first direction and the second direction.

FIG. 1 illustrates a schematic exploded perspective view of a display device according to one or more embodiments.

Referring to FIG. 1, the display device 1 may display an image in a third direction DR3 on a plane defined by a first direction DR1 and a second direction DR2. A front (or top) surface and a back (or bottom) surface of each of the members are separated in the third direction DR3. The directions indicated by the first to third directions DR1, DR2, and DR3 may be converted to other directions as a relative concept.

The display device 1 may display a moving image or a still image. For example, the display device 1 may be used as a display screen of various products, such as a television, a laptop computer, a monitor, a billboard, the Internet of things (IOT), etc., as well as portable electronic devices, such as a mobile phone, a smart phone, a tablet personal computer, a mobile communication terminal, an electronic notebook, an e-book, a portable multimedia player (PMP), a navigation system, and an ultra-mobile PC (UMPC). In addition, the display device 1 according to one or more embodiments may be used in a wearable device, such as a smart watch, a watch phone, a glasses display, or a head mounted display (HMD). In addition, the display device 1 according to one or more embodiments may be used as an instrument panel of a vehicle, a center information display (CID) provided at a center fascia or dashboard of a vehicle, a room mirror display that replaces a side mirror of a vehicle, or a display provided on a back surface of a front seat of a vehicle. FIG. 1 illustrates that the display device 1 according to one or more embodiments is used as a smart phone for convenience of description.

The display device 1 according to one or more embodiments may include a cover window WU, a display panel DP, a component 70, and a housing member HM.

The cover window WU may be positioned on the display panel DP to protect the display panel DP from external impact. The cover window WU may include a transmission area TA and a blocking area BA. The transmissive area TA may be an optically transparent area, and may be an area through which incident light is transmitted. The blocking area BA may be an area having relatively low light transmittance as compared to the transmissive area TA. A blocking area BA defines a shape of the transmissive area TA. The blocking area BA may surround the transmissive area TA. The blocking area BA may overlap the peripheral area PA of the display panel DP to block the peripheral area PA from being viewed from the outside.

The cover window WU may include a hole area HA. The hole area HA may overlap the component 70 to be described later. The component 70 may operate by receiving external signals provided through the hole area HA. The hole area HA may be positioned in the transmissive area TA. The hole area HA may have a circular shape in a plan view, and a size or shape may be variously changed. A position and number of hole areas HA may be variously changed.

The display panel DP may be a flat rigid display panel, or may be a flexible display panel. The display panel DP according to one or more embodiments may be an emissive display panel. For example, the display panel DP may be an organic light-emitting display panel or a quantum dot light-emitting display panel. An emission layer of the organic light-emitting display panel may include an organic light-emitting material. An emission layer of the quantum dot light-emitting display panel may include a quantum dot and a quantum rod. Hereinafter, the display panel DP will be described as an organic light-emitting display panel.

The display panel DP may include a display area DA and a peripheral area PA. The display area DA, which is an area in which an image is displayed, may correspond to a screen. The peripheral area PA, which is an area in which an image is not displayed, may surround at least a portion of the display area DA. The display area DA may have an approximately rectangular shape in a plan view. The display area DA may have a polygonal shape, such as a triangle, a pentagon, or a hexagon, a circular shape, an oval shape, or an irregular shape. A corner of an edge of the display area DA may have a round shape.

Pixels PX are arranged in the display area DA, and an image may be displayed by a combination of the pixels PX. The pixels PX may be positioned in various shapes, such as a stripe arrangement, a PENTILE™ arrangement (e.g., a PENTILE™ matrix structure, a PENTILE™ structure, or an RGBG structure, PENTILE™ being a registered trademark of Samsung Display Co., Ltd., Republic of Korea), or a mosaic arrangement along a first direction and a second direction to display an image. The display panel DP may include pixel circuits and signal lines for driving the pixels PX. The display panel DP may be a light-emitting display panel including light-emitting devices, and each of the light-emitting devices may constitute a pixel PX. The display panel DP may be a touch panel including a touch sensor layer capable of sensing a touch.

The display panel DP according to one or more embodiments may include an opening area OA extending through the display panel DP. The opening area OA may overlap the hole area HA of the cover window WU. The opening area OA may be positioned in the display area DA. The opening area OA may be positioned at an upper center of the display area DA. The opening area OA may be positioned in the display area DA in various ways, such as positioned at an upper left side of the display area DA, or positioned at a right side of the display area DA. The opening area OA may have a circular shape in a plan view, and a size or shape may be variously changed. A position and number of opening areas OA may be variously changed.

Some of the pixels PX in the display area DA may be positioned to surround the opening area OA. Accordingly, an image may also be displayed in an area adjacent to the opening area OA.

The display panel DP extends from the display area DA, and includes a peripheral area PA in which a plurality of signal lines and a pad portion are positioned. A data driver 50 may be positioned in the peripheral area PA. According to one or more embodiments, the pad portion of the periph- eral area PA may be electrically connected to a printed circuit board PCB including a driving chip 80.

The component 70 for adding various functions to the display device 1 may be positioned corresponding to the opening region OA. The component 70 may be electrically connected to the display panel DP through a connector or the like. The component 70 may include at least one of a light-emitting module, a light-sensing module, and/or a photographing module. For example, the component 70 may include at least one of a light-emitting module for outputting infrared rays, a CMOS sensor for detecting infrared rays, and/or a camera module for capturing an external subject. A subject received through the hole area HA and the opening area OA may be photographed. The component 70 may be configured as a single module, may include a plurality of modules, and may be arranged in various sizes and posi- tional relationships.

A housing member HM is positioned at a lower side of the display panel DP. The housing member HM is coupled to the cover window WU to constitute an exterior of the display device 1. The housing member HM may include a material having relatively high rigidity. For example, the housing member HM may include a plurality of frames and/or plates made of glass, plastic, or metal. The display panel DP and the component 70 may be positioned in an internal space of the display device 1 defined by the cover window WU and the housing member HM. The display panel DP may be accommodated in the internal space to be protected from external impact.

Figure 2:
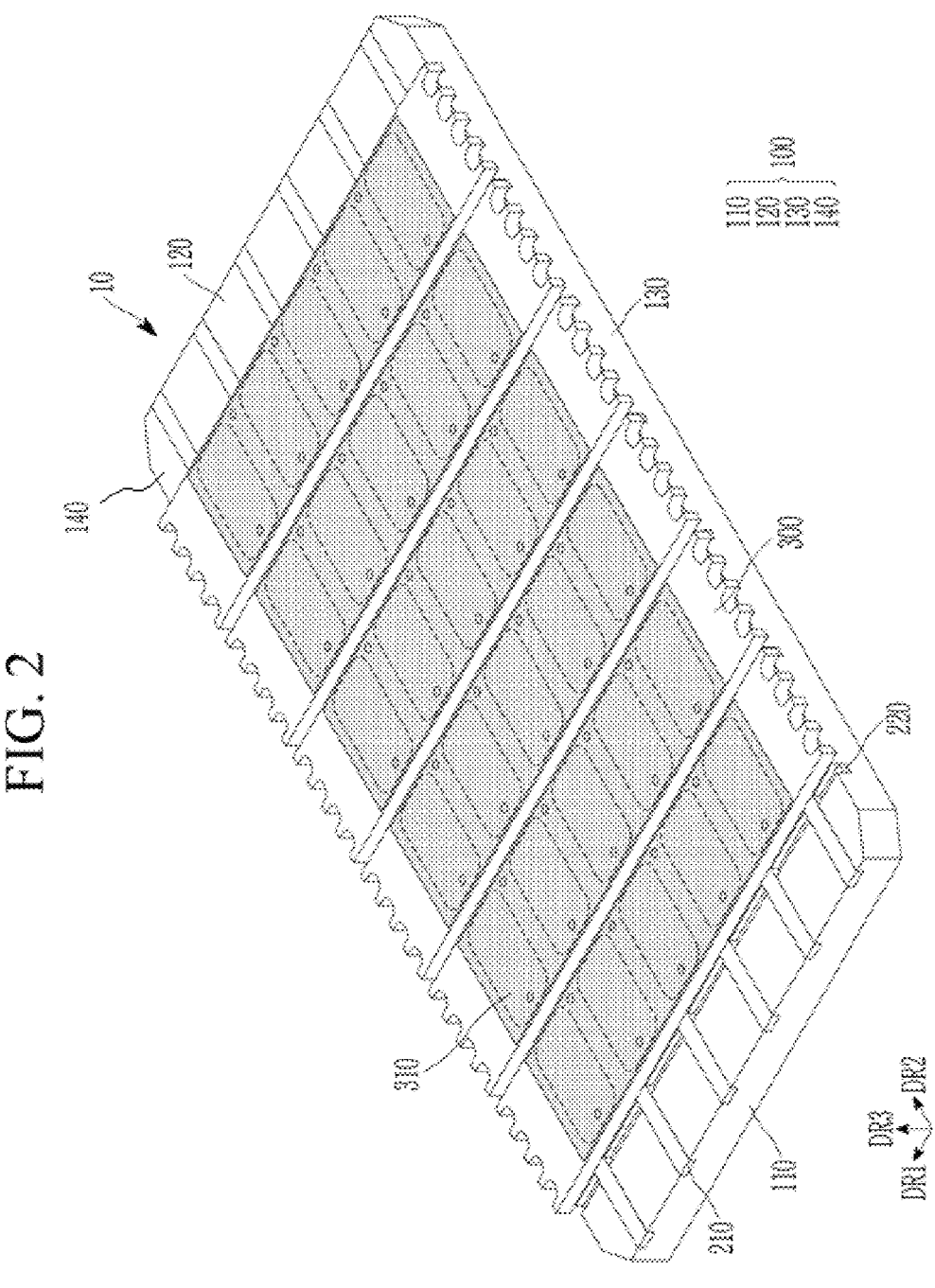
FIG. 2 illustrates a perspective view of a mask assembly according to one or more embodiments.
Figure 3:
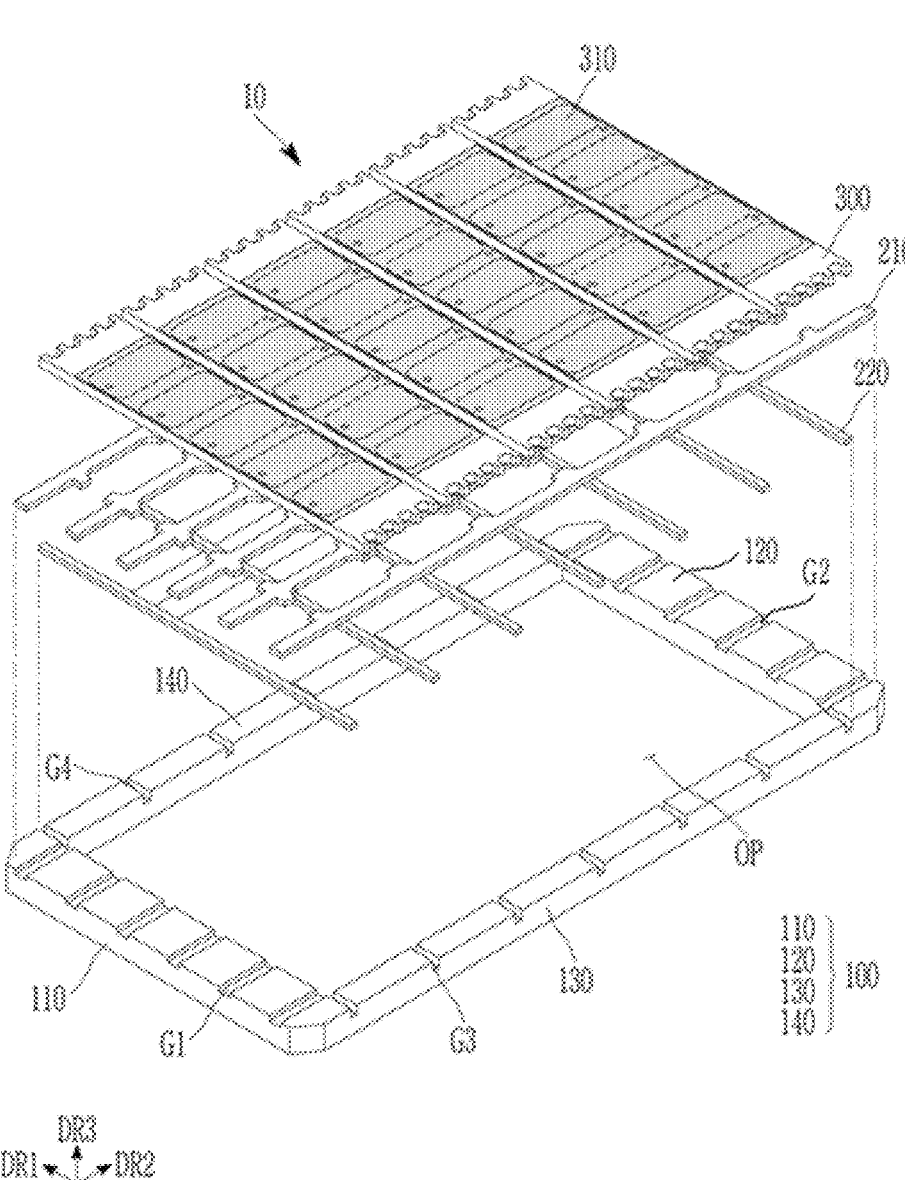
FIG. 3 illustrates an exploded perspective view of the mask assembly illustrated in FIG. 2.

FIG. 2 illustrates a perspective view of a mask assembly 10 according to one or more embodiments. FIG. 3 illustrates an exploded perspective view of the mask assembly 10 illustrated in FIG. 2.

Referring to FIG. 2 and FIG. 3, the mask assembly 10 may include a frame 100, first support sticks 210, second support sticks 220, and mask sticks 300.

The frame 100 may have a substantially rectangular shape having an opening OP. The frame 100 may include four sides 110, 120, 130, and 140. The opening OP of the frame 100 may be defined by four sides 110, 120, 130, and 140. The first side 110 may face the second side 120, and the third side 130 may face the fourth side 140.

First grooves G1 are formed in the first side 110, and second grooves G2 are formed in the second side 120. Third grooves G3 are formed in the third side 130, and fourth grooves G4 are formed in the fourth side 140. The first grooves G1 and the second grooves G2 may be paired, and the third grooves G3 and the fourth grooves G4 may be paired.

The frame 100 may be formed of a material having relatively high rigidity and less deformation so as to fix the mask sticks 300. For example, the frame 100 may be formed of an alloy, such as Invar®, which is a registered trademark of Aperam Alloys Imphy, or stainless steel.

The first support sticks 210 may be positioned to cross the opening OP of the frame 100 in the second direction DR2, and may be fixed to the frame 100. The first support sticks 210 may have a longitudinal direction (or referred to as an extension direction) parallel to the second direction DR2. Opposite ends of the first support stick 210 may be respec- tively inserted into the first groove G1 of the first side 110 and into the second groove G2 of the second side 120, and may be welded to the first side 110 and the second side 120. A depth of the first groove G1 and the second groove G2 may be substantially the same as a thickness of the first support stick 210. Accordingly, the opposite ends of the first support stick 210 may be respectively accommodated in the first groove G1 and the second groove G2 such that an upper surface of the first support stick 210 and an upper surface of the frame 100 are substantially flush/level with each other.

The first support sticks 210 may support the mask sticks 300. The first support sticks 210 may suppress deformation of frame 100. The mask stick 300 may be divided into pattern areas 310 of unit cells by the first support sticks 210. A pattern area 310 of a unit cell may correspond to one display panel. The pattern area 310 may be formed to correspond to a shape of the display panel. The pattern area 310 may have, for example, a rectangular shape, and edge corners thereof may have a round shape. In this case, the first support sticks 210 may include a wing shape corresponding to a chamfered portion of each corner of the pattern areas 310 to define the pattern areas 310 of the mask stick 300.

The second support sticks 220 may be positioned to cross the opening OP of the frame 100 in the first direction DR1, and may be fixed to the frame 100. The longitudinal direc- tion of the second support sticks 220 may be parallel to the first direction DR1. Opposite ends of the second support stick 220 may be respectively inserted into the third groove G3 of the third side 130 and the fourth groove G4 of the fourth side 140, and may be welded to the third side 130 and the fourth side 140.

The second support sticks 220 may be fixed to be posi- tioned below the first support sticks 210. That is, the second support sticks 220 may be positioned between the frame 100 and the first support sticks 210. A depth of the second groove G2 and the fourth groove G4 may be substantially equal to a sum of a thickness of the first support stick 210 and a thickness of the second support stick 220 such that the upper surface of the first support stick 210 and the upper surface of the frame 100 are substantially flush/level with each other. A thickness of the first support stick 210 and a thickness of the second support stick 220 may be the same as each other, or different from each other.

The second support sticks 220 may support the first support sticks 210, and may indirectly support the mask sticks 300. The second support sticks 220 may suppress deformation of frame 100. The second support stick 220 may block a gap between adjacent mask sticks 300, and may be referred to as a gap stick. The second support stick 220 may reduce or prevent the likelihood of a deposition mate- rial being deposited on a mother substrate or through the gap between the mask sticks 300.

The first support sticks 210 and the second support sticks 220 may be formed of an alloy of a metal (e.g., stainless steel).

The mask sticks 300 may be positioned to cross the opening OP of the frame 100 in the first direction DR1, and may be fixed to the frame 100. The mask stick 300 may be fixed to the third side 130 and the fourth side 140 of the frame 100 through welding while being stretched in the longitudinal direction. A tension welding machine may be used for tensioning and welding the mask stick 300, and opposite ends of the mask stick 300 may have a structure suitable for clamping to enable tensioning.

The mask sticks 300 may be combined to form a mask corresponding to one mother substrate. Accordingly, the mask stick 300 may be referred to as a division mask. Each of the mask sticks 300 may include a plurality of pattern areas 310 corresponding to a plurality of cells. Each of the pattern areas 310 may include, for example, through-holes corresponding to a pattern of emission layers of a corresponding color (e.g., red emission layers, green emission layers, or blue emission layers) to be formed in each cell of the mother substrate.

The mask stick 300 may be formed of a metal or an alloy (e.g., an alloy, such as Invar®, which is a registered trademark of Aperam Alloys Imphy, or stainless steel). The mask sticks 300 may be referred to as a fine metal mask (FMM).

The mask sticks 300 may be positioned on the first support sticks 210. A lower surface of the mask sticks 300 may be in contact with an upper surface of the first support sticks 210. The mask sticks 300 are supported by the first support sticks 210 to suppress sagging or deformation.

Figure 4:
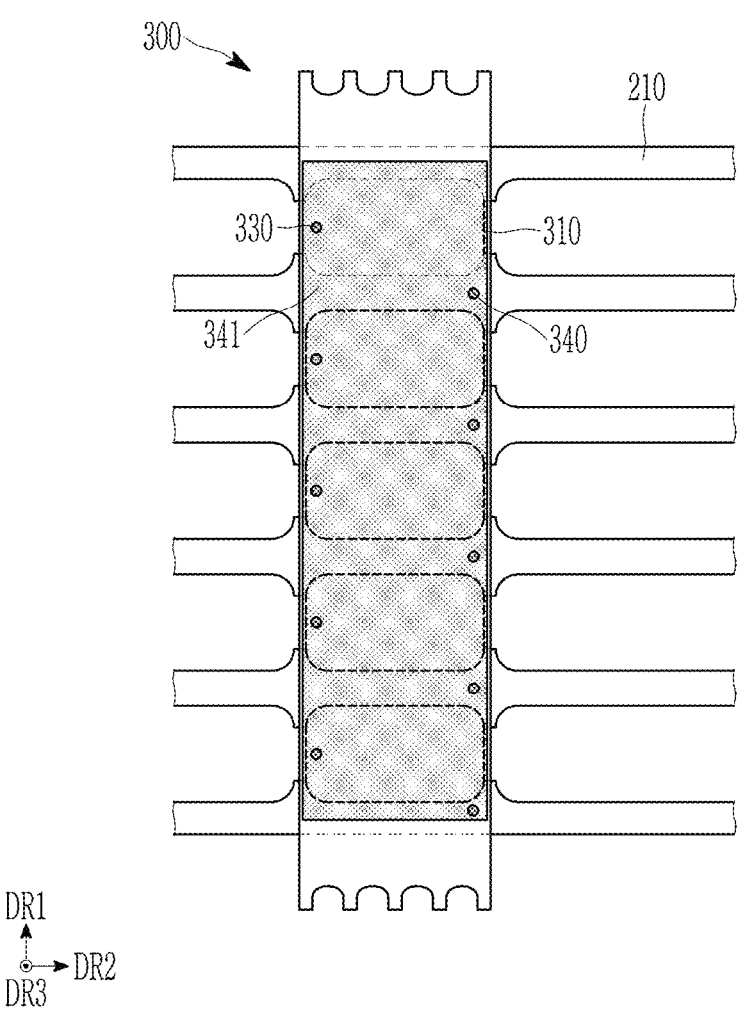
FIG. 4 illustrates a top plan view of a mask according to one or more embodiments.
Figure 5:
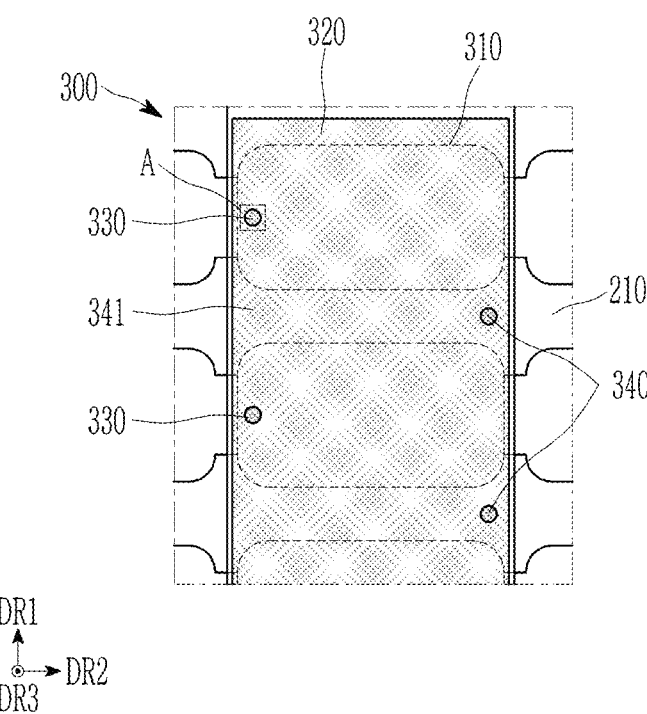
FIG. 5 illustrates an enlarged top plan view of a portion of a mask stick according to one or more embodiments.

FIG. 4 illustrates a top plan view of the mask stick 300 according to one or more embodiments. FIG. 5 illustrates an enlarged top plan view showing a portion of the mask stick of FIG. 4.

Referring to FIG. 4 and FIG. 5, the mask stick 300 may extend lengthwise in the first direction DR1, and may include a plurality of pattern areas 310. The first support sticks 210 may divide the through-holes 320 of the mask stick 300 into pattern areas 310 of unit cells. An area where the first support sticks 210 and the mask stick 300 overlap may be referred to as a division area 341 that separates the pattern areas 310 of the mask stick 300.

A pattern area 310 of a unit cell may correspond to one display panel DP. The pattern area 310 may have a substantially rectangular shape including a short side in the first direction DR1 and a long side in the second direction DR2. A corner of an edge of the pattern area 310 may have a round shape.

The pattern area 310 may include through-holes 320 corresponding to a pattern of emission layers of a corresponding color (e.g., red emission layers, green emission layers, or blue emission layers) to be formed in each cell of a substrate. A deposition material forming each light-emitting layer may pass through the through-holes 320 of the mask stick 300 to be deposited on each cell of the substrate. Because deposition materials pass through the through-holes 320 formed in the pattern area 310 to form emission layers located on a display area of the display panel, the pattern area 310 may be referred to as a deposition area.

The pattern area 310 may include a first non-hole portion 330 corresponding to the opening area OA (refer to FIG. 1) of the display area. The first non-hole portion 330 may be an area in which no through-hole 320 is formed. For example, the first non-hole portion 330 may include a concave portion formed on a bottom surface of the mask stick 300 instead of the through-hole 320 extending through the mask stick 300.

Referring to FIG. 4, the mask stick 300 includes a first side parallel to the first direction DR1, and a second side parallel to the first direction DR1 and opposite the first side.

According to one or more embodiments, a plurality of first non-hole portions 330 at the first side of the mask stick 300 may be positioned along the first direction DR1. The first non-hole portions 330 may exist in the pattern area 310. The first non-hole portions 330 may be implemented in various ways to correspond to the size or shape of the opening area of the display panel.

A plurality of second non-hole portions 340 on the second side of the mask stick 300 may be positioned along the first direction DR1. The second non-hole portions 340 may be positioned between respective pattern areas 310. The second non-hole portions 340 may be positioned in a portion where the mask stick 300 and the first support stick 210 overlap (e.g., in a division area 341 that separates the pattern areas 310 of the mask stick 300).

The second non-hole portion 340 may be an area in which no through-hole 320 is formed. For example, the second non-hole portion 340 may include a concave portion formed on a bottom surface of the mask stick 300 instead of the through-hole 320 extending through the mask stick 300. The bottom surface of the mask stick 300 is in a direction in which the mask stick 300 faces a frame of the mask assembly.

In one or more embodiments, the first non-hole portion 330 and the second non-hole portion 340 may have a same planar area. The first non-hole portion 330 and the second non-hole portion 340 may have a same shape and size in a plan view. Numbers of the first non-hole portions 330 and the second non-hole portions 340 positioned on one mask stick 300 may be the same. The first and second non-hole portions 330 and 340 may each include a pattern in which a plurality of concave portions 322 are spaced apart from each other. The patterns of the concave portions positioned in the first non-hole portions 330 and the concave portion positioned in the second non-hole portions 340 may be the same or different. The concave portions positioned in the first and second non-hole portions 330 and 340 may have various shapes, sizes, and depths.

As such, the mask stick 300 according to one or more embodiments may provide the second non-hole portion 340 at a second side of the mask stick 300 so as to correspond to the first non-hole portion 330 positioned at a first side of the mask stick 300, thereby ameliorating left-right asymmetry of the mask stick 300. In addition, when the mask stick 300 is stretched, bending of the mask stick may be reduced or minimized, thereby improving pixel position accuracy.

Figure 6:
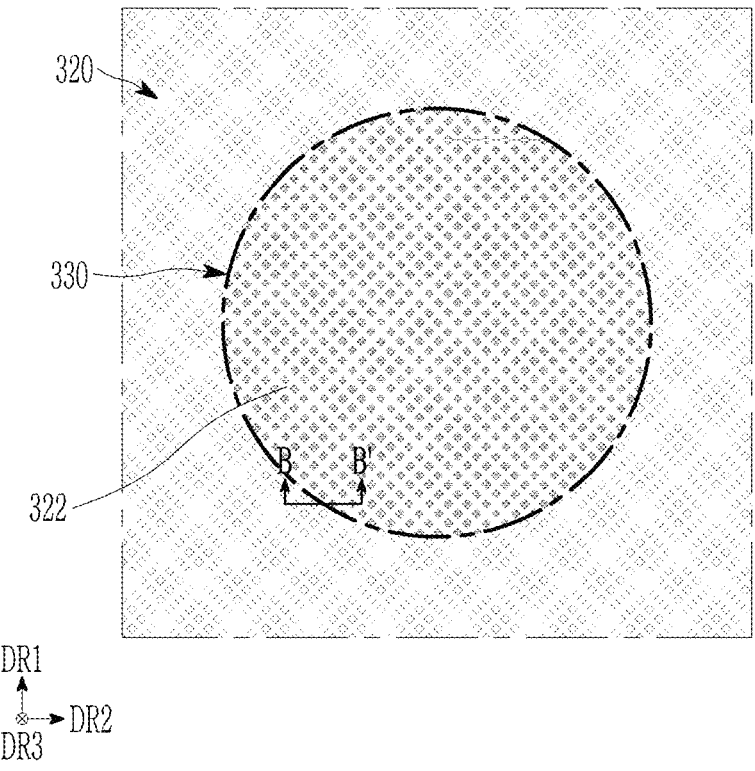
FIG. 6 illustrates an enlarged bottom view showing a portion A of FIG. 5.

Hereinafter, a non-hole portion according to one or more embodiments will be described with reference to FIG. 6 and FIG. 7. FIG. 6 illustrates a bottom view showing a portion A of the mask stick of FIG. 5 when viewed from below, and FIG. 7 illustrates a cross-sectional view taken along the line B-B' of FIG. 6.

The first non-hole portion 330 may be a blocked portion in which the through-holes 320 do not exist in a plan view when viewed from above, or may be a portion having a pattern of a plurality of concave portions 322 as illustrated in FIG. 6 when viewed from below.

Figure 7:
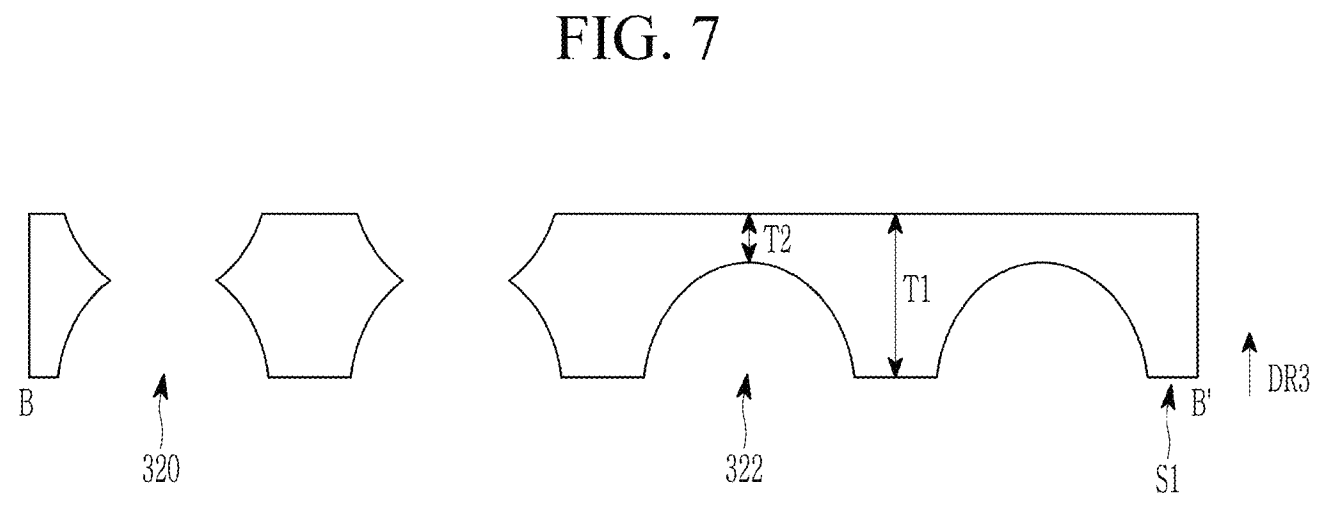

Referring to FIG. 6 and FIG. 7, the through-holes 320 extending through the mask stick 300 do not exist in the first non-hole portion 330. The first non-hole portion 330 may include a concave portion 322 formed on a bottom surface S1 of the mask stick 300, instead of the through-hole 320 extending through the mask stick 300. The bottom surface S1 of the mask stick 300 is in a direction in which the mask stick 300 faces a frame of the mask assembly.

As illustrated in FIG. 7, the concave portion 322 may have a depth that is less than a thickness of the mask stick in the third direction DR3, which is a thickness direction of the mask stick 300. A thickness T2 of the mask stick 300 in a portion where the concave portion 322 is positioned may be thinner than a thickness T1 of the mask stick 300 in a portion in which the concave portion is not positioned.

In one or more embodiments, the through-hole 320 may have a cross-sectional shape of an approximate hourglass as illustrated, but may have various cross-sectional shapes, such as a rectangle, a trapezoid, or a bell in other embodiments. The concave portion 322 may have a cross-sectional shape of a substantially half-moon shape as illustrated, but may have various cross-sectional shapes, such as a quadrangle, a trapezoid, or a triangle.

In manufacturing the mask stick according to one or more embodiments, the through-hole 320 and the concave portion 322 may be formed through a wet-etching process or the like. For example, a plurality of concave portions may be formed through a first etching process, and the concave portions may be additionally etched through a second etching process to form a through-hole.

Referring to FIG. 6, the first non-hole portion 330 may include a plurality of concave portions 322 arranged at regular intervals. In the pattern area 310, the through-hole 320 and the concave portion 322 may have a same size and shape in a plan view, and may be positioned at a regular interval. The concave portion 322 may have a different size and/or shape from the through-hole 320 in a plan view, and may be positioned at a same interval or different intervals. According to one or more embodiments, the through-hole 320 and the concave portion 322 may have various planar shapes and cross-sectional shapes, and may be arranged in various positional relationships.

As the first non-hole portion 330 includes the pattern of the concave portion 322, a stress may be allowed to be applied to the non-hole portion in which the through-hole is not formed. Accordingly, it is possible to maintain a balance of the overall stress generated by a tensile force applied to a mask stick 300.

Because the through-holes 320 extending through the mask are not formed in the first non-hole portion 330 of the mask stick 300, no deposition material may pass therethrough, and accordingly, it is possible to reduce or prevent the likelihood of deposition of the deposition material in a cell area corresponding to the first non-hole portion 330. For example, the deposition material may be an organic material including emission layers of a corresponding color. That is, organic materials may not be deposited on a portion where an opening is to be formed in the display area corresponding to the first non-hole portion 330. A cell portion on which the organic material is not deposited by the first non-hole portion 330 may be cut by a laser or the like to form an opening area OA extending through the display panel DP. Because the organic material is not deposited at a position where the opening area OA is to be formed, process defects caused by foreign substances may be reduced in the process of forming the opening area OA by irradiating a laser or the like.

As such, as the first non-hole portion 330 corresponding to the opening area OA is included when manufacturing the display panel DP including the opening area OA, a deposition material is not applied to the opening area OA, a defect rate may be reduced by reducing or minimizing foreign substances generated when the opening area OA is formed by laser processing later.

Figure 8:
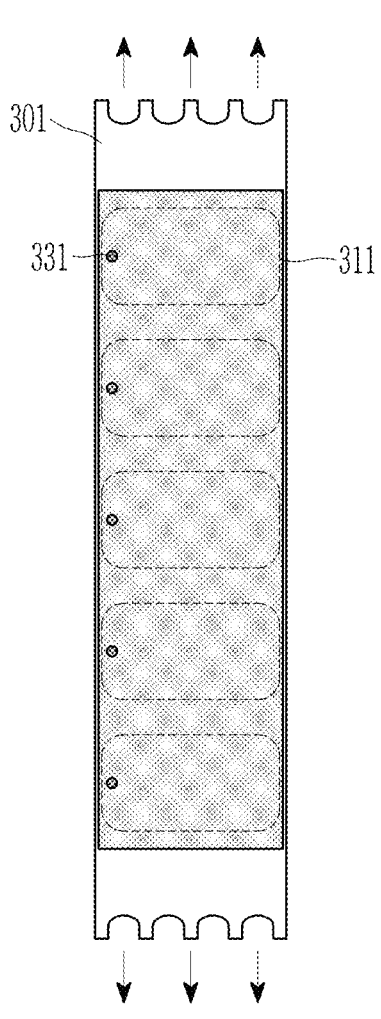
FIG. 8 illustrates a top plan view of a mask stick according to a comparative/contrasting example.
Figure 8:
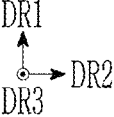

FIG. 8 illustrates a top plan view of a mask stick 301 according to a comparative/contrasting example.

The mask stick 301 according to a comparative/contrasting example may extend lengthwise in the first direction DR1, and may include a plurality of pattern areas 311 corresponding to a plurality of cells. One cell may correspond to one display panel DP. One pattern area 311 corresponding to one cell may be configured as an approximate rectangle including a short side in the first direction DR1 and a long side in the second direction DR2.

The mask stick 301 includes a first side parallel to the first direction DR1, and a second side parallel to the first direction DR1 and opposite the first side. A plurality of pattern areas 311 of the mask stick 301 may be arranged such that short sides thereof are positioned in parallel in the first direction DR1.

The mask stick 301 according to the comparative/contrasting example includes a non-hole portion 331 only in the pattern area 311. The non-hole portion 331 may be positioned inside the pattern area 311. A plurality of non-hole portions 331 may be positioned parallel to the first direction DR1 at a first side of the mask stick 301, and a second side of the mask stick 301 may not include a non-hole portion. Accordingly, when the mask stick 301 is stretched, degrees of left and right contraction of the first side including the non-hole portions 331 and the second side including no non-hole portion are different, and accordingly, the mask stick may be bent.

That is, in the mask stick 301 according to the comparative/contrasting example, the non-hole portion 331 is positioned only at a first side of the mask stick 301, and thus when the mask stick 301 is stretched, the mask stick may be bent left and right asymmetrically depending on presence or absence of the non-hole portion 331. Accordingly, when the mask stick 301 is fixed to a frame in a state in which it is stretched in both directions, the mask stick 301 may have asymmetry due to a difference between degrees of contraction of the mask at a first end including the non-hole portion 331 corresponding to an opening of the display panel and a second end including no non-hole portion, and accordingly, pixel position accuracy may be misaligned, which may result in defects in a pattern deposited on a substrate.

Figure 9B:
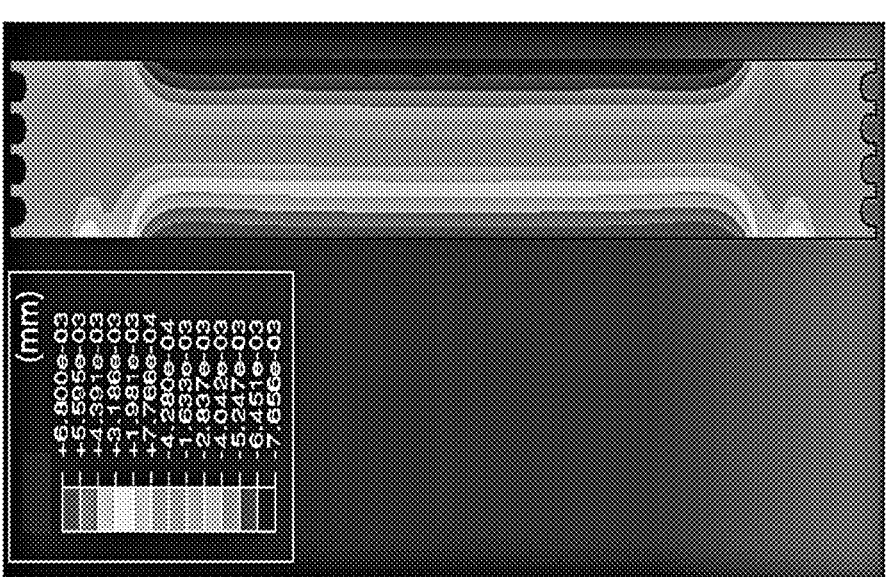
FIG. 9A and FIG. 9B each illustrate a diagram simulating a contraction degree when a mask stick is stretched.
Figure 9A:
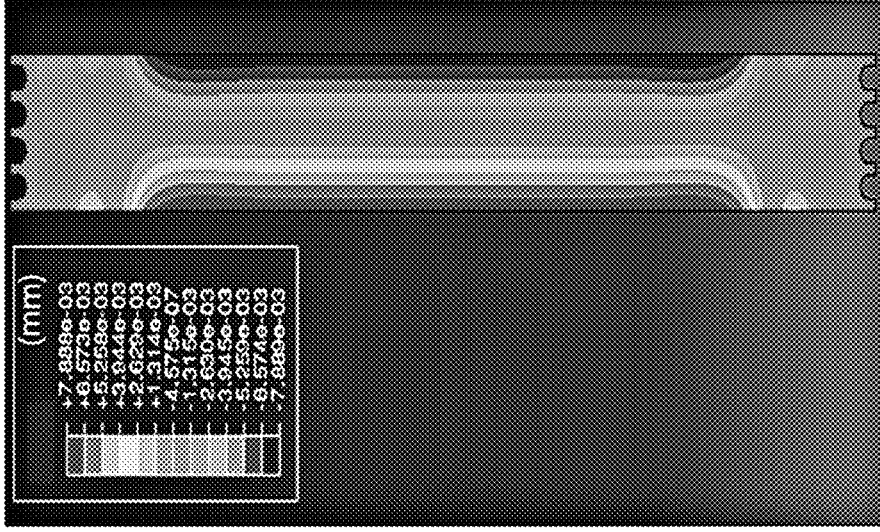

FIG. 9A and FIG. 9B each illustrate a simulating diagram showing a contraction degree when a mask stick is stretched. FIG. 9A illustrates a diagram simulating a degree of contraction when the mask stick 300 is stretched according to one or more embodiments. FIG. 9B illustrates a diagram simulating a degree of contraction when the mask stick 301 is stretched according to a comparative/contrasting example.

The mask stick may be fixed to the frame in a tensioned state in the first direction DR1, which is a longitudinal direction. When the mask stick is stretched, it may expand in the first direction DR1, and may be relatively contracted in the second direction DR2. In the simulation drawing, a direction of contraction is defined as a (+) direction or a (−) direction. When the contraction occurs in a right direction, it is indicated as (+), and when the contraction occurs in a left direction, it is indicated as (−). The degree of contraction is expressed in units of millimeters (mm). In the simulation drawing, when the mask stick is stretched in the first direction DR1, a middle portion thereof may hardly contract in the second direction DR2, a degree of contraction at a first side positioned on left may decrease from an edge to a central portion (e.g., toward the right (+) direction), and a degree of contraction at a second side positioned on the right may decrease from the edge to the central portion (e.g., toward the left side (−) direction).

FIG. 9A illustrates a simulation diagram for a degree of contraction when the mask stick 300 (e.g., the mask stick 300 in which the first non-hole portion 330 is positioned at a first side (left side) and the second non-hole portion 340 is positioned at a second side (right side)) is tensioned according to one or more embodiments.

Referring to FIG. 9A, it can be seen that contraction of about 7.888 μm occurred in the right (+) direction in an edge region where the contraction occurred the most at the first side, and contraction of about 7.889 μm occurred in the left (−) direction in an edge region where the contraction occurred the most at the second side. It can be seen that degrees of contraction during tension of the mask stick 300 are almost the same with a difference of 0.001 μm. According to one or more embodiments, the mask stick 300 includes both the plurality of first non-hole portions 330 on the first side and the plurality of second non-hole portion 340 on the second side, and thus degrees of left and right contraction during tension may be almost the same, thus reducing or preventing the likelihood of the mask stick 300 being bent during tension, and improving pixel position accuracy.

FIG. 9B illustrates a simulation diagram for a degree of contraction when the mask stick 300 (e.g., the mask stick 300 in which the first non-hole portion 330 is positioned only at a first side (left side)). When through-holes of the mask stick 301 are asymmetric with respect to the tensile direction DR1, the mask stick may be distorted. For example, the first side at which the non-hole portion 331 is positioned may be relatively less contracted than the second side at which no non-hole portion is positioned. Referring to FIG. 9B, it can be seen that contraction of about 6.800 μm occurred in the right (+) direction in an edge region where the contraction occurred the most at the first side, and contraction of about 7.656 μm occurred in the left (−) direction in an edge region where the contraction occurred the most at the second side. That is, the mask stick may be bent to the left with a relatively large amount of contraction. Accordingly, the mask stick may be bent during tension and the pixel position accuracy may be misaligned, which may lead to a defect in a pattern deposited on the substrate.

As such, the mask stick 300 according to one or more embodiments, unlike the mask stick 301 according to the comparative/contrasting example, may provide the second non-hole portion 340 at a second side of the mask so as to correspond to the first non-hole portion 330 positioned at a first side of the mask stick 300, thereby ameliorating left-right asymmetry of the mask stick 300. In addition, when the mask stick 300 is stretched, bending of the mask stick may be reduced or minimized, thereby improving pixel position accuracy.

Figure 10:
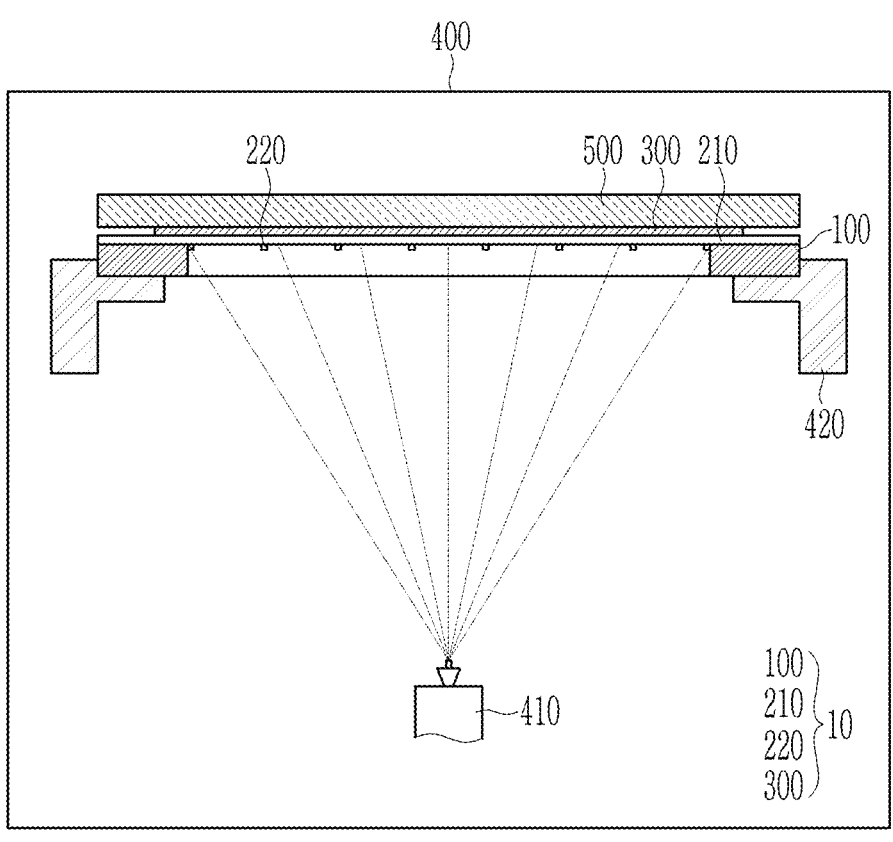
FIG. 10 illustrates a schematic view showing deposition using a mask assembly according to one or more embodiments.

FIG. 10 illustrates a schematic view showing deposition using a mask assembly 10 according to one or more embodiments.

Deposition may be performed by using a deposition apparatus, which includes the chamber 400 and the deposition source 410, and the mask assembly 10. The chamber 400 forms an internal space in which a deposition process is performed. The holder 420 may be positioned in the chamber 400, and the frame 100 of the mask assembly 10 may be detachably fixed to the holder 420. The mother substrate 500 may be positioned on the mask assembly 10 to be aligned with the mask assembly 10. The deposition source 410 may store and spray a deposition material to be deposited on the mother substrate 500.

When, for example, an emission-layer-forming material evaporates from the deposition source 410 positioned at a lower side of the chamber 400, the emission-layer-forming material is deposited on the mother substrate 500 through through-holes of the mask stick 300, so that emission layers may be formed at a desired portion. There are concave portions in which the through-holes are blocked on a bottom surface of the mask stick 300 in the non-hole portion positioned in a pattern area, and thus it is possible to reduce or prevent the likelihood of a deposition material passing therethrough, and to reduce or prevent the likelihood of an organic material being deposited at a position where an opening of the display area is to be formed afterwards.

Accordingly, it is possible to reduce or minimize foreign substances generated when an opening is subsequently formed in the display panel.

The first support stick 210 of the mask assembly 10 may reduce or prevent the likelihood of the emission-layer-forming material passing therethrough, thereby partitioning each pattern area of the mask stick 300. The second support stick 220 of the mask assembly 10 may reduce or prevent the likelihood of the emission-layer-forming material being deposited on the mother substrate 500 through a gap between mask sticks 300.

Figure 11:
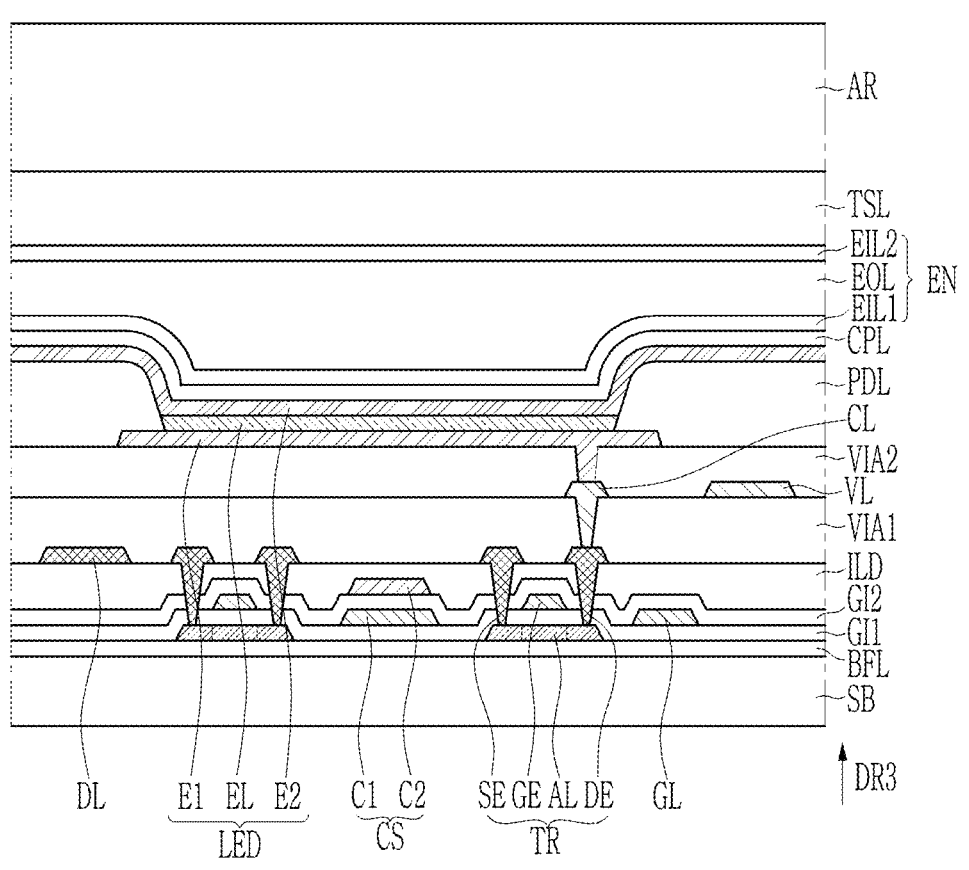
FIG. 11 illustrates a schematic cross-sectional view showing a stacked structure of a display panel according to one or more embodiments.

FIG. 11 illustrates a schematic cross-sectional view showing a stacked structure of a display panel according to one or more embodiments. Cells formed on the mother substrate 500 through the deposition process illustrated in FIG. 10, etc. may be divided to be used as a display panel of a display device. The cross-section illustrated in FIG. 11 may correspond to approximately one pixel area.

The display panel basically includes a substrate SB, a transistor TR formed on the substrate SB, and a light-emitting diode LED connected to the transistor TR. The light-emitting diode LED may correspond to the pixel.

The substrate SB may be made of a material, such as glass. The substrate SB may be a flexible substrate including a polymer resin, such as polyimide, polyamide, or polyethylene terephthalate.

A buffer layer BFL may be located on the substrate SB. The buffer layer BFL may improve the characteristics of the semiconductor layer by blocking impurities from the substrate SB when the semiconductor layer is formed, and may flatten a surface of the substrate SB to relieve a stress of the semiconductor layer. The buffer layer BFL may include an inorganic insulating material, such as a silicon nitride ($SiN_x$), a silicon oxide ($SiO_x$), or a silicon oxynitride ($SiO_xN_y$), and may be a single layer or multiple layers. The buffer layer BFL may include amorphous silicon (Si).

A semiconductor layer AL of a transistor TR may be located on the buffer layer BFL. The semiconductor layer AL may include a first region and a second region, and a channel region therebetween. The semiconductor layer AL may include any one of amorphous silicon, polysilicon, and an oxide semiconductor. For example, the semiconductor layer AL may include low temperature polysilicon (LTPS), and may include an oxide semiconductor material including at least one of zinc (Zn), indium (In), gallium (Ga), and/or tin (Sn). For example, the semiconductor layer AL may include an indium-gallium-zinc oxide (IGZO).

A first gate insulating layer GI1 may be located on the semiconductor layer AL. The first gate insulating layer GI1 may include an inorganic insulating material, such as a silicon nitride, a silicon oxide, and a silicon oxynitride, and may be a single layer or multiple layers.

The first gate conductive layer, which may include a gate electrode GE of the transistor TR, a gate line GL, and a first electrode C1 of a capacitor CS, may be located on the first gate insulating layer GI1. The first gate conductive layer may include molybdenum (Mo), aluminum (Al), copper (Cu), titanium (Ti), and the like, and may be a single layer or multiple layers.

A second gate insulating layer GI2 may be located on the first gate conductive layer. The second gate insulating layer GI2 may include an inorganic insulating material, such as a silicon nitride, a silicon oxide, and a silicon oxynitride, and may be a single layer or multiple layers.

A second gate conductive layer that may include a second electrode C2 of the capacitor CS and the like may be located on the second gate insulating layer GI2. The second gate conductive layer may include molybdenum (Mo), aluminum (Al), copper (Cu), titanium (Ti), and the like, and may be a single layer or multiple layers.

An interlayer insulating layer ILD may be located on the second gate insulating layer GI2 and the second gate conductive layer. The interlayer insulating layer ILD may include an inorganic insulating material, such as a silicon nitride, a silicon oxide, and a silicon oxynitride, and may be a single layer or multiple layers.

A first data conductive layer that may include a first electrode SE and a second electrode DE, a data line DL, and the like of the transistor TR may be located on the interlayer insulating layer ILD. The first electrode SE and the second electrode DE may be respectively connected to a first region and a second region of the semiconductor layer AL through contact holes of the insulating layers GI1, GI2, and ILD. One of the first electrode SE and the second electrode DE may serve as a source electrode, and the other may serve as a drain electrode. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers.

A first planarization layer VIA1 may be located on the first data conductive layer. The first planarization layer VIA1 may be an organic insulating layer. For example, the first planarization layer VIA1 may contain poly(methyl methacrylate), a general purpose polymer, such as polystyrene, a polymer derivative having a phenolic group, an acrylic polymer, an imide-based polymer, polyimide, and an organic insulating material, such as a siloxane-based polymer.

A second data conductive layer, which may include a voltage line VL, a connection line CL, and the like, may be located on the first planarization layer VIA1. The voltage line VL may transfer voltages, such as a driving voltage, a common voltage, an initialization voltage, and a reference voltage. The connection line CL may be connected to the second electrode DE of the transistor TR through a contact hole of the first planarization layer VIA1. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like, and may be a single layer or multiple layers.

A second planarization layer VIA2 may be located on the second data conductive layer. The second planarization layer VIA2 may be an organic insulating layer. For example, the second planarization layer VIA2 may contain poly(methylmethacrylate), a general purpose polymer, such as polystyrene, a polymer derivative having a phenolic group, an acrylic polymer, an imide-based polymer, polyimide, and an organic insulating material, such as a siloxane-based polymer.

A first electrode E1 of the light-emitting diode LED is located on the second planarization layer VIA2. The first electrode E1 may be referred to as a pixel electrode. The first electrode E1 may be connected to the connection line CL through a contact hole formed in the second planarization layer VIA2. Accordingly, the first electrode E1 may be electrically connected to the second electrode DE of the transistor TR to receive a data signal for controlling luminance of the light-emitting diode LED. The transistor TR to which the first electrode E1 is connected may be a driving transistor or a transistor that is electrically connected to the driving transistor. The first electrode E1 may be formed of a reflective conductive material or a translucent conductive material, or may be formed of a transparent conductive material. The first electrode E1 may include a transparent conductive material, such as an indium tin oxide (ITO) or an indium zinc oxide (IZO). The first electrode E1 may include a metal, such as lithium (Li), calcium (Ca), aluminum (Al), silver (Ag), magnesium (Mg), or gold (Au), or a metal alloy.

A pixel definition layer PDL, which may be an organic insulating layer, may be located on the second planarization layer VIA2. The pixel definition layer PDL may be referred to as a partition wall, and may have an opening overlapping the first electrode E1.

An emission layer EL of the light-emitting diode LED may be located on the first electrode E1. In addition to the emission layer EL, at least one of a hole injection layer, a hole transport layer, an electron transport layer, and/or an electron injection layer may be located on the first electrode E1. The aforementioned mask assembly 10 may be used to deposit the emission layer EL.

A second electrode E2 of the light-emitting diode LED is located on the emission layer EL. The second electrode E2 may be referred to as a common electrode. The second electrode E2 may be made of a low work function metal, such as calcium (Ca), barium (Ba), magnesium (Mg), aluminum (Al), silver (Ag), or a metal alloy, as a thin layer to have light transmittance. The second electrode E2 may include a transparent conductive oxide, such as an indium tin oxide (ITO) or an indium zinc oxide (IZO).

The first electrode E1, the emission layer EL, and the second electrode E2 of each pixel may constitute a light-emitting diode LED, such as an organic light-emitting diode. The first electrode E1 may be an anode of the light-emitting diode LED, and the second electrode E2 may be a cathode of the light-emitting diode LED.

A capping layer CPL may be located on the second electrode E2. The capping CPL may increase light efficiency by adjusting a refractive index. The capping layer CPL may be located to entirely cover the second electrode E2. The capping layer CPL may include an organic insulating material, or may include an inorganic insulating material.

An encapsulation layer EN may be located on the capping layer CPL. The encapsulation layer EN may encapsulate a light-emitting diode LED to reduce or prevent the likelihood of moisture or oxygen penetrating from the outside. The encapsulation layer EN may be a thin film encapsulation layer including one or more inorganic layers EIL1 and EIL2 and one or more organic layers EOL.

A touch sensor layer TSL including touch electrodes may be located on the encapsulation layer EN. The touch electrodes may have a mesh shape having an opening overlapping the light-emitting diode LED. An anti-reflection layer AR for reducing external light reflection may be located on the touch sensor layer TSL.

A cover window for entirely protecting an entire surface of the display panel may be positioned on the anti-reflection layer AR.

A passivation film may be located to protect the display panel below the substrate SB. A functional sheet including at least one of a cushion layer, a heat dissipation sheet, a light-blocking sheet, a waterproof tape, and/or an electromagnetic barrier layer may be positioned under the protection film.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims, with functional equivalents thereof to be included therein.

What is claimed is:

1. A mask assembly comprising:

a frame defining an opening;

a mask stick above the frame, extending in a first direction, defining through-holes therein, and comprising:

pattern areas that comprise one or more first non-hole portions in which no through-hole exists at a first side of the mask stick; and one or more second non-hole portions in which no through-hole exists at a second side of the mask stick; and a first support stick between the frame and the mask stick, extending in a second direction crossing the first direction, and overlapping the one or more second non-hole portions, wherein the second side is disposed opposite to the first side with respect to a longitudinal central axis of the mask stick.

2. The mask assembly of claim 1, wherein the pattern areas are divided by areas where the mask stick and the first support stick overlap.

3. The mask assembly of claim 1, wherein a number of the one or more first non-hole portions is equal to a number of the one or more second non-hole portions of the mask stick.

4. The mask assembly of claim 1, wherein the mask stick is configured to be fixed to the frame to be tensioned in the first direction.

5. The mask assembly of claim 1, wherein the one or more first non-hole portions and the one or more second non-hole portions have a same planar area.

6. The mask assembly of claim 1, wherein the one or more first non-hole portions or the one or more second non-hole portions comprises concave portions at a surface of the mask stick, and having a thickness that is less than a thickness of the mask stick.

7. The mask assembly of claim 1, wherein the one or more first non-hole portions or the one or more second non-hole portions comprises concave portions at regular intervals.

8. The mask assembly of claim 1, wherein the one or more first non-hole portions or the one or more second non-hole portions comprises concave portions having a same planar shape.

* * * * *